(12) United States Patent
Mou et al.

(10) Patent No.: US 11,454,232 B2
(45) Date of Patent: Sep. 27, 2022

(54) MICRO-ELECTROMECHANICAL SYSTEMS PUMP

(71) Applicant: MICROJET TECHNOLOGY CO., LTD., Hsinchu (TW)

(72) Inventors: Hao-Jan Mou, Hsinchu (TW);
Rong-Ho Yu, Hsinchu (TW);
Cheng-Ming Chang, Hsinchu (TW);
Hsien-Chung Tai, Hsinchu (TW);
Wen-Hsiung Liao, Hsinchu (TW);
Chi-Feng Huang, Hsinchu (TW);
Yung-Lung Han, Hsinchu (TW);
Chun-Yi Kuo, Hsinchu (TW)

(73) Assignee: MICROJET TECHNOLOGY CO., LTD., Hsinchu (TW)

(*) Notice: Subject to any disclaimer, the term of this patent is extended or adjusted under 35 U.S.C. 154(b) by 98 days.

(21) Appl. No.: 16/825,100

(22) Filed: Mar. 20, 2020

(65) Prior Publication Data

US 2020/0309111 A1 Oct. 1, 2020

(30) Foreign Application Priority Data

Mar. 29, 2019 (TW) .................................. 108111384

(51) Int. Cl.
*F04B 43/04* (2006.01)
*H01L 41/09* (2006.01)
*F04B 45/047* (2006.01)

(52) U.S. Cl.
CPC .......... *F04B 43/046* (2013.01); *F04B 45/047* (2013.01); *H01L 41/0973* (2013.01)

(58) Field of Classification Search
CPC ...... F04B 43/046; F04B 43/043; F04B 43/04; F04B 45/047; H01L 41/0973
See application file for complete search history.

(56) References Cited

U.S. PATENT DOCUMENTS 9,611,843 B2 * 4/2017 Hsueh ................... F04B 43/046
10,180,199 B2 * 1/2019 Huang ................... F04B 39/12
(Continued)

FOREIGN PATENT DOCUMENTS

CN 106062364 A 10/2016
CN 106142841 A 11/2016
(Continued)

*Primary Examiner* — Nathan C Zollinger
(74) *Attorney, Agent, or Firm* — McClure, Qualey & Rodack, LLP (57) ABSTRACT

A micro-electromechanical systems pump includes a first substrate, a first oxide layer, a second substrate, and a piezoelectric element. The first oxide layer is stacked on the first substrate. The second substrate is combined with the first substrate, and the second substrate includes a silicon wafer layer, a second oxide layer, and a silicon material layer. The silicon wafer layer has an actuation portion. The actuation portion is circular and has a maximum stress value and an actuation stress value. The second oxide layer is formed on the silicon wafer layer. The silicon material layer is located at the second oxide layer and is combined with the first oxide layer. The piezoelectric element is stacked on the actuation portion, and has a piezoelectric stress value. The maximum stress value is greater than the actuation stress value, and the actuation stress value is greater than the piezoelectric stress value.

19 Claims, 6 Drawing Sheets

(56) References Cited

U.S. PATENT DOCUMENTS

| | | | |
|---|---|---|---|
| 2011/0070110 A1* | 3/2011 | Hirata | F04B 43/043 417/413.2 |
| 2012/0171062 A1* | 7/2012 | Kodama | F04B 43/046 417/413.2 |
| 2013/0058818 A1* | 3/2013 | Hirata | F04B 45/047 417/479 |
| 2020/0088185 A1* | 3/2020 | Mou | H01L 41/0973 |

FOREIGN PATENT DOCUMENTS

| | | | |
|---|---|---|---|
| TW | M574151 U | 2/2019 | |
| WO | WO-2015045727 A1 * | 4/2015 | F04B 41/02 |

* cited by examiner

MICRO-ELECTROMECHANICAL SYSTEMS PUMP

CROSS-REFERENCE TO RELATED APPLICATION

This non-provisional application claims priority under 35 U.S.C. § 119(a) to Patent Application No. 108111384 filed in Taiwan, R.O.C. on Mar. 29, 2019, the entire contents of which are hereby incorporated by reference.

BACKGROUND

Technical Field

The present disclosure relates to a micro-electromechanical systems (MEMS) pump, in particular, to a micro-electromechanical systems pump which is manufactured by semiconductor fabrication processes.

Related Art

With the rapid development of technology, the application of fluid transport devices is becoming much more diversified. It can be seen in industrial applications, biomedical applications, medical cares, electronic heat dissipation devices, etc., and even in wearable devices, which attracts a lot of attention recently. Thus, it can be understood that there is a trend that a size of traditional pumps has gradually become smaller and the fluid transporting capacity of the pumps has become larger. The micro-electromechanical systems pump can greatly reduce the size of the fluid transporting device. Therefore, the micro-electromechanical systems pump is obviously the main development point of minimizing the size of the fluid transporting device.

Figure 1:
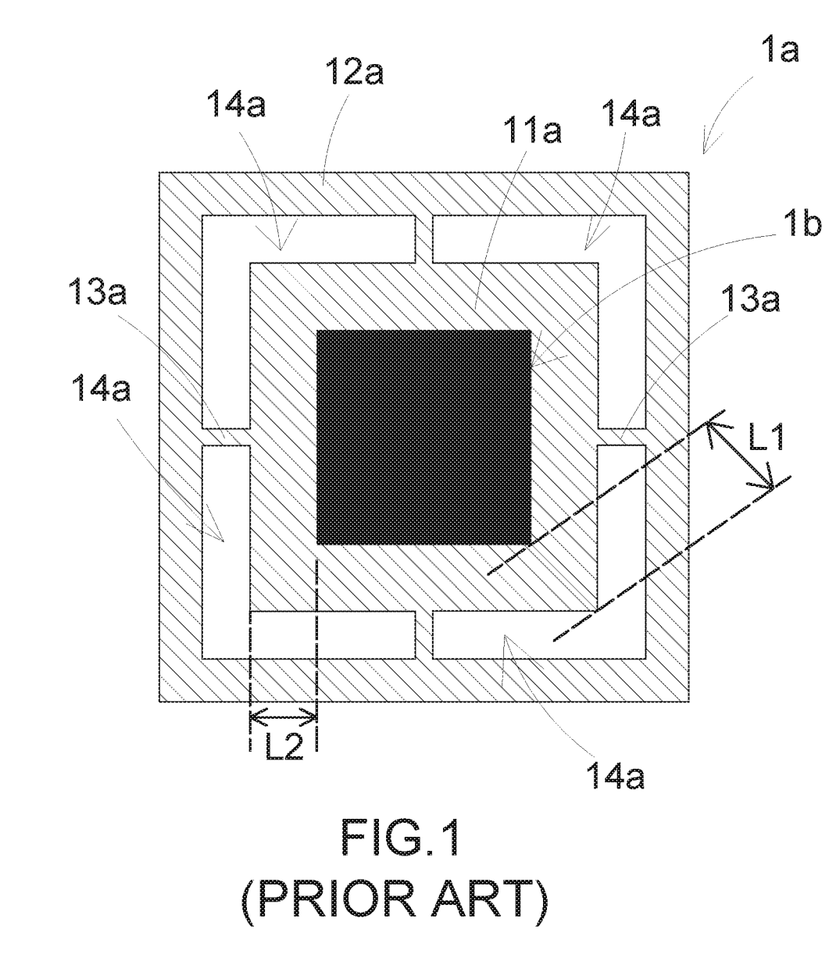
FIG. 1 illustrates a top view of actuation sheet and a piezoelectric sheet in a micro-electromechanical systems pump known to the inventors.

Please refer to FIG. 1. FIG. 1 shows an actuation sheet 1a and a piezoelectric sheet 1b of a micro-electromechanical systems pump known to the inventors. The actuation sheet 1a includes an actuation portion 11a, an outer peripheral portion 12a, a plurality of connection portions 13a, and a plurality of gaps 14a. Since the piezoelectric sheet 1b is made from a piezoelectric material, through applying an AC voltage to the piezoelectric sheet 1b, the piezoelectric sheet 1b is deformed correspondingly to the voltage value and the frequency of the AC voltage due to the inverse piezoelectric effect. Thus, the actuation portion 11a connecting to the piezoelectric sheet 1b can be driven upward or downward correspondingly as well. The fluid in the micro-electromechanical systems pump is pushed and driven by a movement of the actuation portion 11a, and the fluid is finally discharged from the gaps 14a. Among those elements, the actuation portion 11a of the actuation sheet 1a, the outer peripheral portion 12a, and the piezoelectric sheet 1b are square. Consequently, the distance between the periphery of the piezoelectric sheet 1b and the periphery of the actuating portion 11a are not equal. For example, the first distance L1 between a corner of the piezoelectric plate 1b and a corner of the actuation portion 11a is greater than the second distance L2 between a side of the piezoelectric sheet 1b and a side of the actuation portion 11a. Accordingly, when the actuation portion 11a is driven by the piezoelectric sheet 1b, the piezoelectric sheet 1b forces the actuation portion 11a in an uneven manner, resulting in the place where the actuating portion 11a generates the maximum displacement being not in the center region of the actuating portion 11a, but being in the four corner regions of the actuation portion 11a. This phenomenon reduces the transmission efficiency of the pump. Therefore, how to improve the efficiency of the micro-electromechanical systems pump but maintain the stability of the operation process simultaneously is a main research direction at present.

SUMMARY

One of the main objects of the present disclosure is providing a micro-electromechanical systems pump, which is a micrometer level electromechanical system pump formed by semiconductor fabrication processes to reduce the size limitation on the pump.

In order to achieve aforementioned object, a general embodiment of the present disclosure is providing a micro-electromechanical systems pump, which includes a first substrate, a first oxide layer, a second substrate, and a piezoelectric element. The first substrate has a plurality of inlets, wherein each of the plurality of inlets is a conical hole. The first oxide layer is stacked on the first substrate, wherein the first oxide layer has a plurality of converging channels and a converging chamber, and the plurality of converging channels is in communication between the converging chamber and the plurality of inlets. The second substrate is combined with the first substrate, and the second substrate includes a silicon wafer layer, a second oxide layer, and a silicon material layer. The silicon wafer layer has an actuation portion, an outer peripheral portion, a plurality of connection portions, and a plurality of fluid channels. The actuation portion is circular and has a maximum stress value and an actuation stress value. The outer peripheral portion is in a hollow ring shape and surrounds the periphery of the actuation portion. The connection portions are respectively connected between the actuation portion and the outer peripheral portion. The fluid channels surround the periphery of the actuation portion and are located between the plurality of connection portions. The second oxide layer is formed on the silicon wafer layer, wherein the second oxide layer is in a hollow ring shape, and the second oxide layer and the silicon wafer layer together define a vibration chamber. The silicon material layer is in a circular shape and located at the second oxide layer, wherein the silicon material layer is combined with the first oxide layer. The silicon material layer has a perforation, a vibration portion, and a fixed portion. The perforation is located in a center portion of the silicon material layer. The vibration portion is located in a peripheral area of the perforation. The fixed portion is located in a peripheral area of the silicon material layer. The piezoelectric element is in a circular shape and is stacked on the actuation portion of the silicon wafer layer, wherein the piezoelectric element has a piezoelectric stress value. The maximum stress value is greater than the actuation stress value, and the actuation stress value is greater than the piezoelectric stress value.

BRIEF DESCRIPTION OF THE DRAWINGS

The disclosure will become more fully understood from the detailed description given herein below for illustration only, and thus not limitative of the disclosure, wherein.

DETAILED DESCRIPTION

The embodiments that present the features and the advantages of the present disclosure will be described in detail in the subsequent paragraphs of the description. It should be understood that the present disclosure may have various modifications in different aspects, all of which do not depart from the scope of the present disclosure, and the descriptions and figures therein are essentially for the purpose of illustration, rather than limiting the scope of the present disclosure.

Figure 2A:
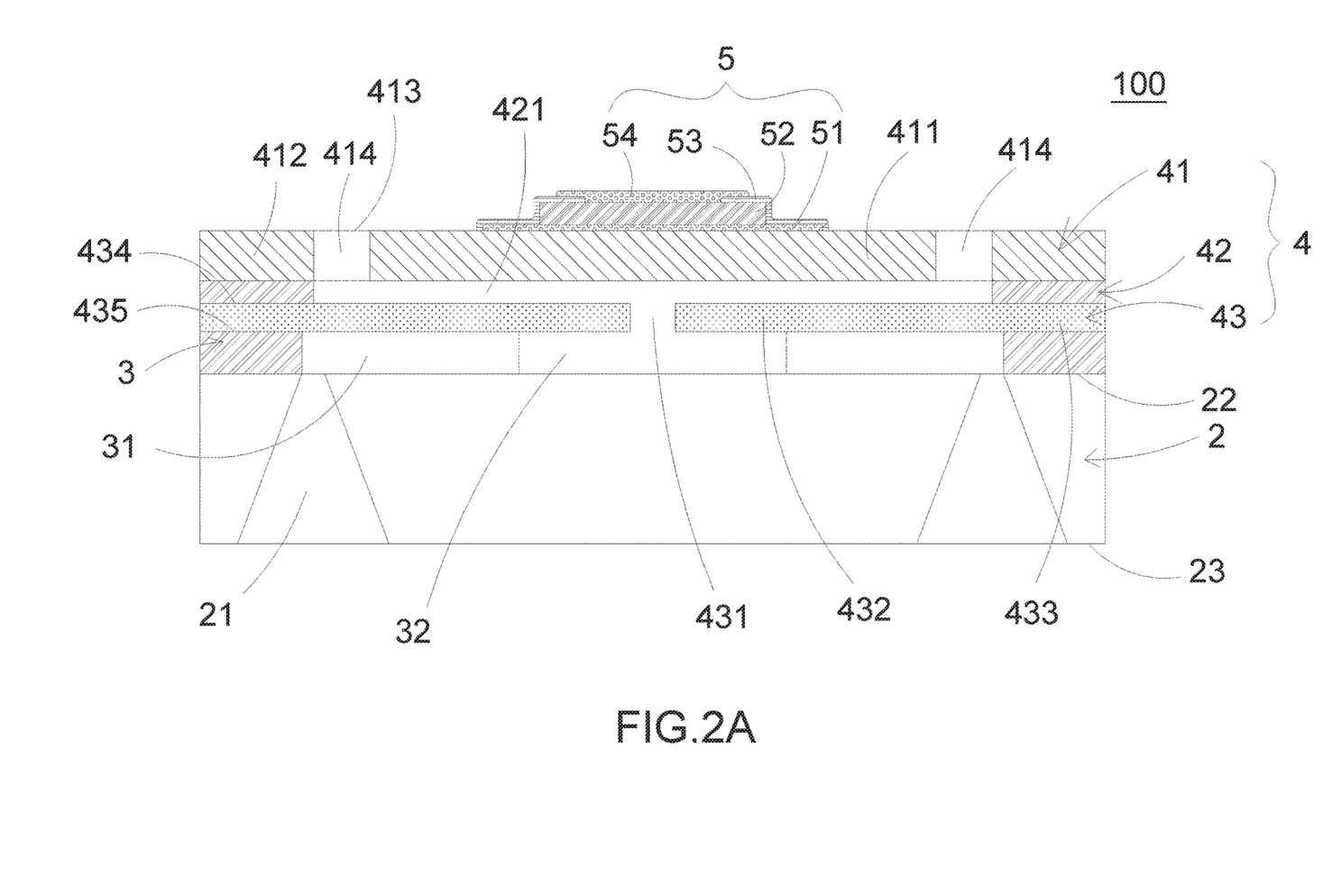
FIG. 2A illustrates a cross-sectional view of a micro-electromechanical systems pump according to an exemplary embodiment of the present disclosure.
Figure 2B:
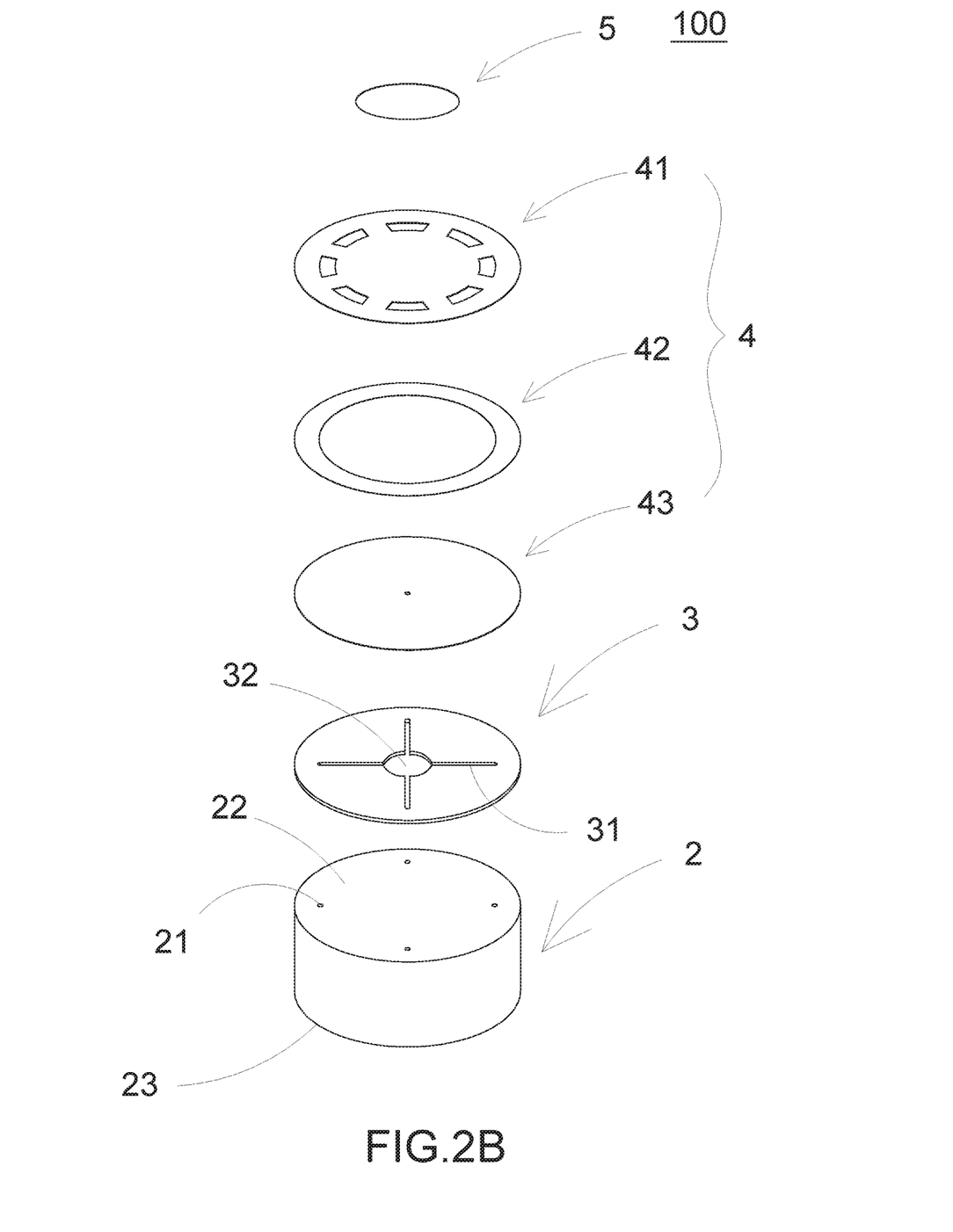
FIG. 2B illustrates an exploded view of a micro-electromechanical systems pump according to an exemplary embodiment of the present disclosure.

According to one or some embodiments, the micro-electromechanical systems pump 100 of the present disclosure can be applied in the fields of medicine, biotechnology, energy, computer technology, printing, etc., and the micro-electromechanical systems pump 100 is used for guiding fluid and is used to increase or control the flow rate of the fluid. Please refer to FIG. 2A and FIG. 2B. FIG. 2A is a cross-sectional view of the micro-electromechanical systems (MEMS) pump 100 according to an exemplary embodiment of the present disclosure, and FIG. 2B is an exploded view of the MEMS pump 100 according to an exemplary embodiment of the present disclosure. It should be understood that in FIG. 2B, components of the MEMS pump 100 cannot be actually taken apart since the MEMS pump 100 is fabricated by MEMS manufacturing processes. However, in order to clearly explain its detailed characteristics, the exploded view is illustrated and used to explain the characteristics. In this embodiment, the MEMS pump 100 includes a first substrate 2, a first oxide layer 3, a second substrate 4, and a piezoelectric element 5.

In some embodiments, the first substrate 2 is a silicon wafer (Si wafer), and the thickness of the Si wafer may be between 150 to 400 μm (micrometer). The first substrate 2 has a plurality of inlets 21, a first surface 22, and a second surface 23. In this embodiment, the number of the inlets 21 is four, but not limited thereto. Each of the inlets 21 is defined through the first substrate 2 from the second surface 23 to the first surface 22. In order to improve the inflow efficiency of the inlets 21, each of the inlets 21 is a conical hole, that is, each of the inlets 21 is conical and tapered from the second surface 23 to the first surface 22.

In some embodiments, the first oxide layer 3 is a silicon dioxide ($SiO_2$) film. The thickness of the $SiO_2$ film is between 10 and 20 μm. The first oxide layer 3 is stacked on the first surface 22 of the first substrate 2. The first oxide layer 3 has a plurality of converging channels 31 and a converging chamber 32. The number and the position of the converging channels 31 correspond to the number and the position of the inlets 21 in the first substrate 2. In this embodiment, the number of the converging channels 31 is four as well. One end of each of the four converging channels 31 is in communication with the corresponding inlet 21 in the first substrate 2. The other end of each of the four converging channels 31 is in communication with the converging chamber 32. Thus, after a fluid enters into the first substrate 2 from the inlets 21, the fluid converges at the converging chamber 32 after flowing through the corresponding converging channels 31.

Please refer to FIG. 2A and FIG. 2B. In some embodiments, the second substrate 4 is a silicon-on-insulator (SOI) wafer, which includes a silicon wafer layer 41, a second oxide layer 42, and a silicon material layer 43. The thickness of the silicon wafer layer 41 is between 10 and 20 μm. The silicon wafer layer 41 has an actuation portion 411, an outer peripheral portion 412, a plurality of connection portions 413, and a plurality of fluid channels 414. The actuation portion 411 is circular and has a maximum stress value and an actuation stress value. The outer peripheral portion 412 is in a hollow ring shape and surrounds the periphery of the actuation portion 411. The connection portions 413 are respectively located between and connected between the actuation portion 411 and the outer peripheral portion 412 for providing elastic support function. The fluid channels 414 surround the periphery of the actuation portion 411 and are located between the plurality of connection portions 413.

The second oxide layer 42 is made of silicon monoxide. The thickness of the second oxide layer 42 is between 0.5 and 2 μm. The second oxide layer 42 is formed on the silicon wafer layer 41, wherein the second oxide layer 42 is in a hollow ring shape, and the second oxide layer 42 and the silicon wafer layer 41 together define a vibration chamber 421. The silicon material layer 43 is in a circular shape and located at the second oxide layer 42, wherein the silicon material layer 43 is combined with the first oxide layer 3. The silicon material layer 43 is a silicon dioxide ($SiO_2$) film, and the thickness of the silicon material layer 43 may be between 2 and 5 μm. Besides, the silicon material layer 43 has a perforation 431, a vibration portion 432, a fixed portion 433, a third surface 434, and a fourth surface 435. The perforation 431 may be located in a center portion of the silicon material layer 43. The vibration portion 432 may be located in a peripheral area of the perforation 431, and the vibration portion 432 may be perpendicularly corresponding to the vibration chamber 421. The fixed portion 433 may be located in a peripheral area of the silicon material layer 43, and the vibration portion 432 is fixed to the second oxide layer 42 by the fixed portion 433. The third surface 434 is assembled with the second surface 42, and the fourth surface 435 is assembled with the first oxide layer 3. The piezoelectric element 5 is circular, as shown in FIG. 2B. The piezoelectric element 5 may be stacked on the actuation portion 411 of the silicon wafer layer 41, and the piezoelectric element 5 has a piezoelectric stress value. The maximum stress value of the actuation portion 411 is greater than the actuation stress value, and the actuation stress value is greater than the piezoelectric stress value of the piezoelectric element 5.

Please refer to FIG. 2A. The piezoelectric element 5 includes a lower electrode layer 51, a piezoelectric layer 52, an insulation layer 53, and an upper electrode layer 54. The lower electrode layer 51 may be stacked on the actuation portion 411 of the silicon wafer layer 41, and the piezoelectric layer 52 may be stacked on the lower electrode layer 51. The piezoelectric layer 52 and the lower electrode layer 51 are electrically connected through the contacted area between each other. Moreover, the width of the piezoelectric layer 52 may be smaller than the width of the lower electrode layer 51, and thus the lower electrode layer 51 is not completely covered by the piezoelectric layer 52. The insulation layer 53 may be stacked on part of the piezoelectric layer 52 and the remaining portion of the surface of the lower electrode layer 51 which is not covered by the piezoelectric layer 52. Then, the upper electrode layer 54 may be stacked on the insulation layer 53 and the remaining portion of the surface of the piezoelectric layer 52 which is not covered by the insulation layer 53, and thus the upper electrode layer 54 may be electrically connected to the piezoelectric layer 52 through the contact between each other. Moreover, since the insulation layer 53 is inserted between the upper electrode layer 54 and the lower electrode layer 51, a short circuit caused by the direct contact between the upper electrode layer 54 and the lower electrode layer 51 could be avoided.

Please still refer to the FIG. 2A. The first oxide layer 3 may be located between the first surface 22 of the first substrate 2 and the silicon material layer 43 of the second substrate 4. The second oxide layer 42 may be located between the silicon material layer 43 of the second substrate 4 and the silicon wafer layer 41. The piezoelectric element 5 may be located at the actuation portion 411 of the silicon wafer layer 41. The first substrate 2, the first oxide layer 3, the silicon material layer 43 of the second substrate 4, the second oxide layer 42, the silicon wafer layer 41, and the piezoelectric element 5 are sequentially arranged and combined into one body. Accordingly, the converging channels 31, which are inside the first oxide layer 3 between the first substrate 2 and the second substrate 4, communicate with the corresponding inlets 21 of the first substrate 2. Moreover, the converging chamber 32 communicates with the perforation 431 of the silicon material layer 43, thereby allowing the gas to pass through the converging channels 31, converge to the converging chamber 32, and flow upward through the perforation 431 after entering into the first substrate 2 from the inlets 21 of the first substrate 2. Furthermore, the vibration chamber 421 of the second oxide layer 42, which is between the silicon material layer 43 and the silicon wafer layer 41, communicates with the perforation 431 of the silicon material layer 43 and the fluid channels 414 of the silicon wafer layer 41. Thus, after the gas entering into the vibration chamber 421 through the perforation 431, the gas can be discharged upward through the fluid channels 414, thereby achieving gas transmission.

As described above, the thickness of the first substrate 2 may be between 150 and 400 μm, and the thickness of the silicon material layer 43 may be between 2 and 5 μm. The thickness of the first oxide layer 3 and the silicon wafer layer 41 may be between 10 and 20 μm.

Figure 3A:
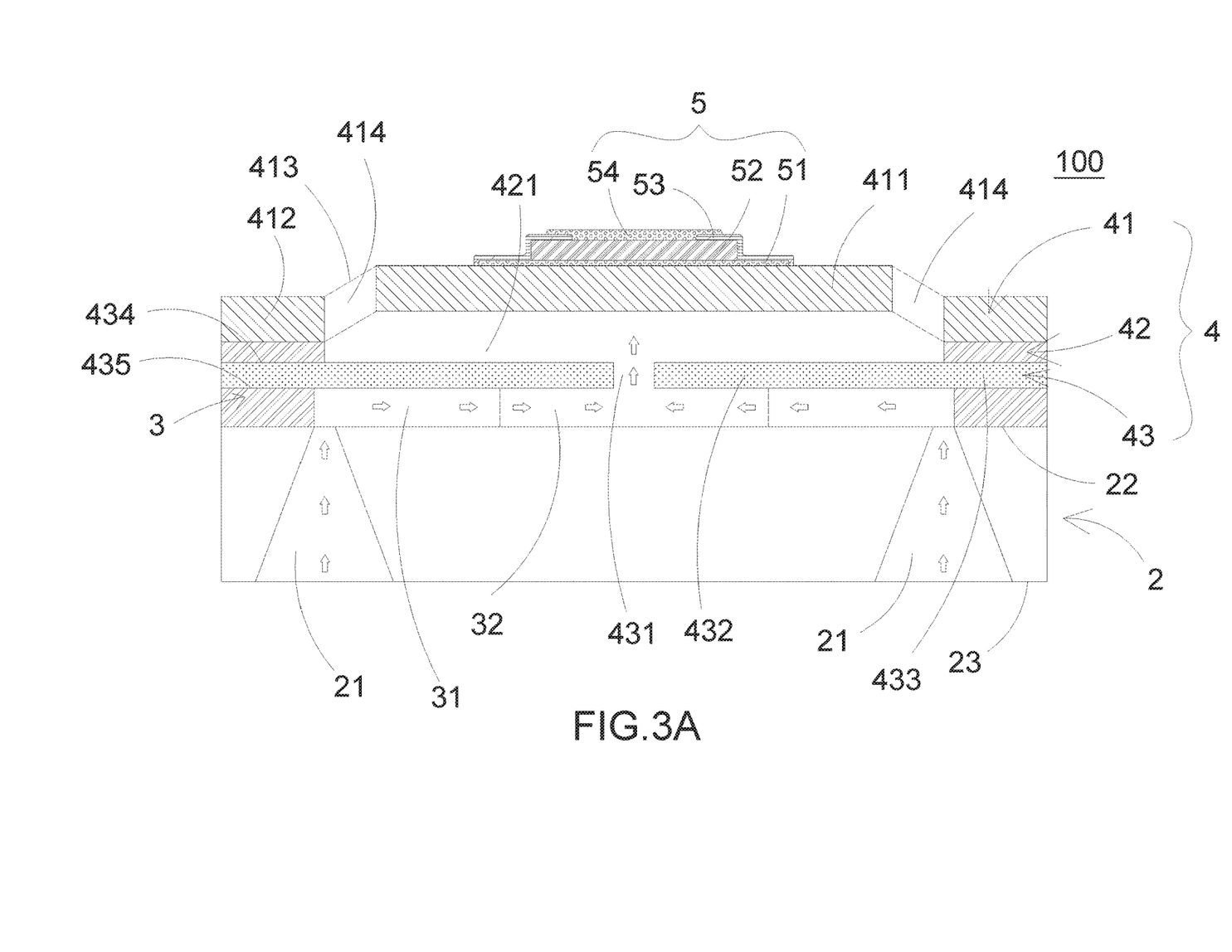
FIGS. 3A to 3C illustrate cross-sectional views of the micro-electromechanical systems pump shown in FIG. 2A at different steps of an actuation process.
Figure 3B:
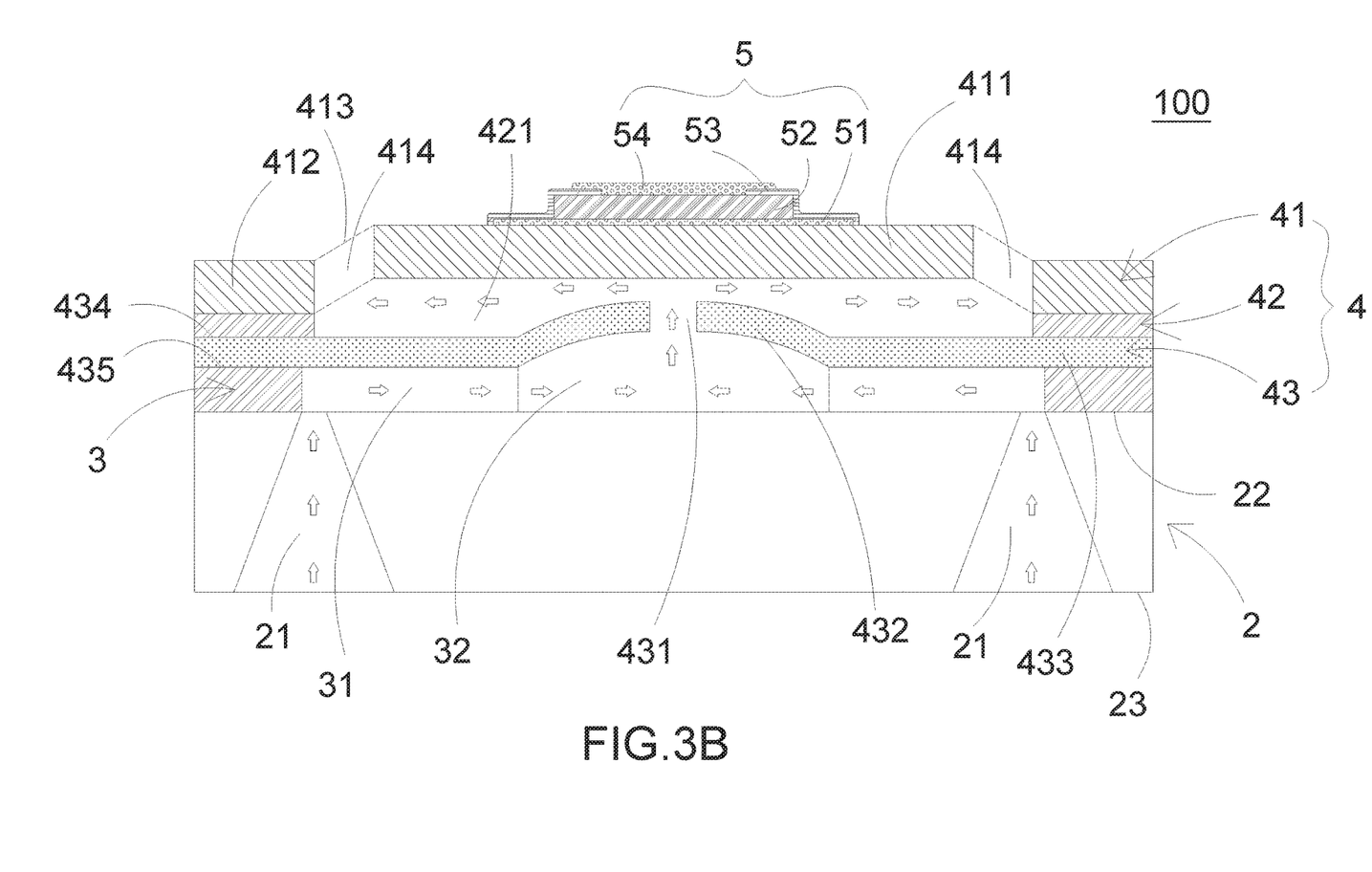
Figure 3C:
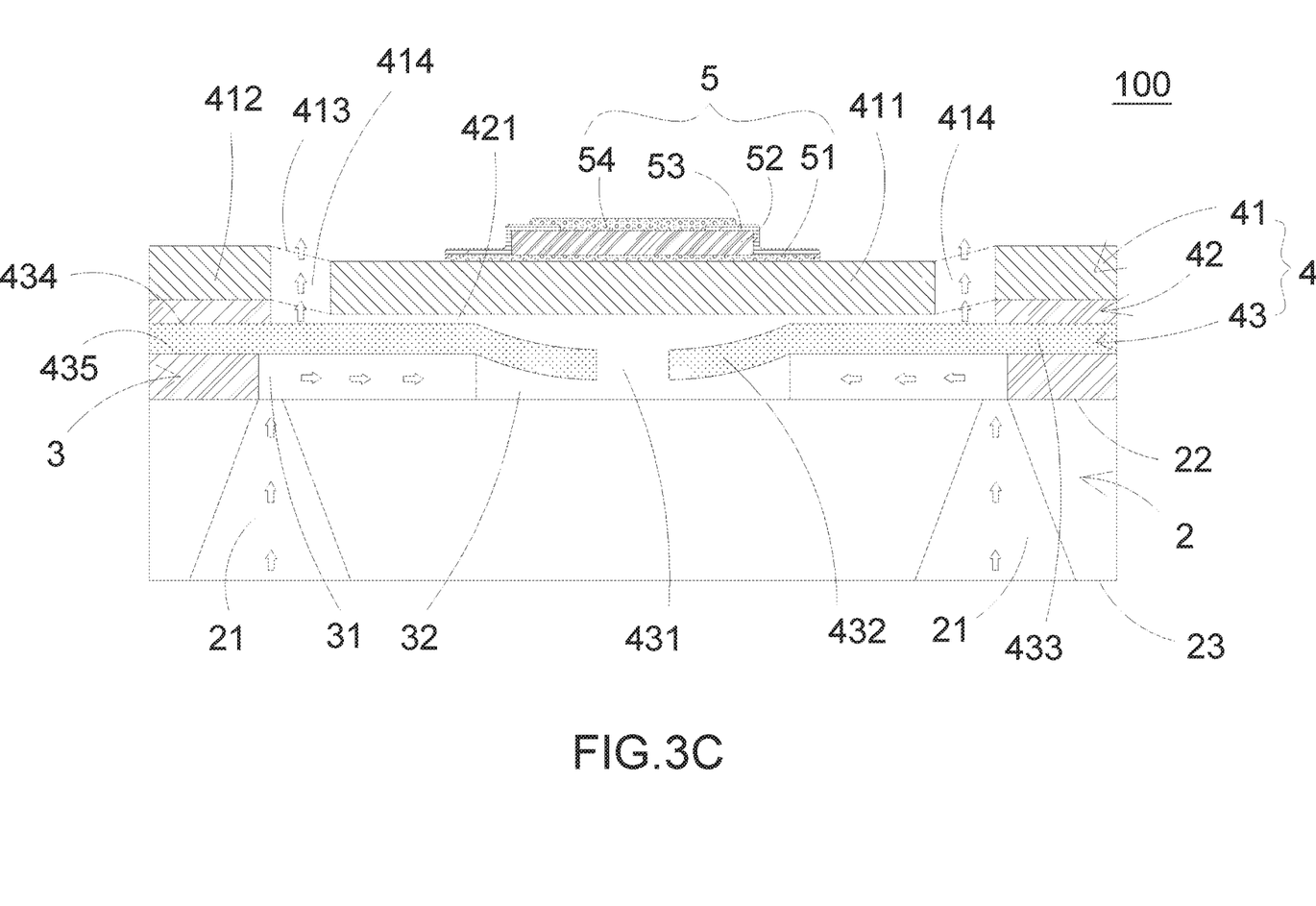

Please refer to FIG. 3A to FIG. 3C. FIG. 3A to FIG. 3C are the schematic views of the MEMS pump according to the present disclosure where the MEMS pump is illustrated in an actuation process at different steps. Please refer to FIG. 3A first. When the lower electrode layer 51 and the upper electrode layer 54 of the piezoelectric element 5 receive a driving voltage and a driving signal (not shown in the figure) transmitted from the external component, the voltage and the signal are transmitted to the piezoelectric layer 52. When the piezoelectric layer 52 receives the driving voltage and the driving signal, the piezoelectric layer 52 starts to deform because of the reverse piezoelectric effect, which drives the actuation portion 411 of the silicon wafer layer 41 to move correspondingly. When the actuation portion 411 is driven upward by the piezoelectric element 5 and thus the distance between the actuation portion 411 and the second oxide layer 42 increases, the volume of the vibration chamber 421 in the second oxide layer 42 increases as well. Hence, the pressure in the vibration chamber 421 becomes negative, and thus the gas in the converging chamber 32 of the first oxide layer 3 is drawn into the vibration chamber 421 through the perforation 431.

Please refer to FIG. 3B. When the actuation portion 411 is driven upward by the piezoelectric element 5, the vibration portion 432 of the silicon material layer 43 is moved upward due to the resonance effect. When the vibration portion 432 is moved upward, the space of the vibration chamber 421 is compressed and the fluid in the vibration chamber 421 is pushed to fluid channels 414 of the silicon wafer layer 41, so that the fluid can be discharged upward through the fluid channels 414. When the vibration portion 432 is moved upward to compress the space of the vibration chamber 421, the volume of the converging chamber 32 increases owing to the movement of the vibration portion 432. Hence, the pressure in the converging chamber 32 becomes negative, and thus the fluid outside of the MEMS pump 100 is drawn into the converging chamber 32 through the inlets 21.

In the last step, as shown in FIG. 3C, when the actuation portion 411 of the silicon wafer layer 41 is driven downward by the piezoelectric element 5, the fluid in the vibration chamber 421 is pushed to the fluid channels 414 and then discharged out. The vibration portion 432 of the silicon material layer 43 is also driven by the actuation portion 411 and thus moved downward; at the same time, the vibration portion 432 compresses the fluid in converging chamber 32 and force the fluid to move to the vibration chamber 421 through the perforation 431. Accordingly, when the actuation portion 411 is driven upward by the piezoelectric element 5 again later, the volume of the vibration chamber 421 greatly increases, thereby generating a larger suction force to draw the gas into the vibration chamber 421. By repeating the aforementioned steps, the actuation portion 411 can be continually driven by the piezoelectric element 5 to move upward and downward, and the vibration portion 432 is also driven to move upward and downward correspondingly. Thus, the internal pressure of the MEMS pump 100 can be changed periodically so as to draw and discharge the fluid continually, thereby completing the pumping process of the MEMS pump 100.

The MEMS pump 100 of the present disclosure is a miniaturized fluid pump fabricated by a micro-electro-mechanical systems process. Since the volume of the fluid pump is extremely small, a higher actuation frequency should be taken to improve its transmission efficiency. However, excessively high actuation frequency may also cause damage to the internal structure of the pump and thus reduce the life span of the device. Therefore, the actuation portion 411 of the MEMS pump 100 of the present disclosure has a maximum stress value and an actuation stress value, and the actuation stress value should be lower than the maximum stress value to prevent from cracking the actuation portion 411. However, the actuation stress value of the actuation portion 411 is affected by its own area, the area of the piezoelectric element 5, and the area of the connection portions 413. A large number of calculations and experiments are needed when it comes to the design among them.

Moreover, the actuation portion 411 has a maximum frequency (critical frequency) and an actuation frequency. When the actuation frequency is greater than the maximum frequency, the actuation portion 411 is damaged due to the excessively high speed of deformation and thus the life span of the device will be reduced. The actuation frequency is affected by the actuation stress value as well. The larger the actuation stress value is, the more the deformation of the actuating portion 411 will be; under the circumstance that the actuation stress value becomes larger, the displacement of the actuating portion 411 increases correspondingly but the actuation frequency decreases. Although the displacement of the actuating portion 411 increases, the actuation portion 411 may be cracked due to the excessive deformation of the actuation portion 411, and the actuation frequency decreases as well. As a result, the transmission efficiency may not be improved in overall condition. On the other hand, when the actuation stress value is small and the actuation frequency increases, the higher actuation frequency may excess the maximum frequency to damage the actuation portion 411. Furthermore, the movement of the actuation portion 411 driven by the smaller actuation stress value is also small. Therefore, the MEMS pump 100 should achieve a balance between the actuation stress value and the actuation frequency under the circumstance that the actuation frequency is lower than the maximum frequency for the purpose of obtaining better transmission efficiency.

According to the foregoing descriptions, after a large number of experiments, the MEMS pump 100 of the present disclosure has obtained that the diameter of the actuation portion 411 of the silicon wafer layer 41 may be between 400 and 550 μm. The diameter of the piezoelectric element 5 may be between 150 and 400 μm. The diameter ratio between the actuation portion 411 and the piezoelectric element 5 may be between 3.6:1 and 1.3:1. The ratio between the area of the connection portions 413 and the area of the fluid channels 414 may be between 0.7:1 and 2.7:1. Under the above mentioned conditions, in one embodiment, the maximum stress value of the actuation portion 411 may be 200 million pascals (Mpa), and the actuation stress value may be between 120 and 160 Mpa. It should be noted that the piezoelectric element 5 itself has a piezoelectric stress value. In order to prevent the stress caused by the deformation of the piezoelectric element 5 from damaging the actuation portion 411, the piezoelectric stress value should be less than the actuation stress value. Preferably, the piezoelectric stress value may be between 30 and 60 Mpa. Under the aforementioned structure, the maximum frequency of the actuation portion 411 may be 2 Mhz, and the actuation frequency may be between 0.8 and 1.9 Mhz.

In summary, the present disclosure provides a micro-electro-mechanical systems pump, which uses a semiconductor process to fabricate the structure of the micro-electro-mechanical systems pump, so as to further reduce the pump size and make it lighter, thinner, and smaller (micro scale). The problem that the previous pump size is too large to reach the micro scale can be solved. Moreover, since the piezoelectric element and the actuation portion are both circular, when the actuation portion is driven by the piezoelectric element, the force applied to the actuation portion can be more even. Furthermore, through tuning the diameter of the actuation portion and the piezoelectric element, and the area of the connection portions and the fluid channels, the actuation stress value (deformation displacement) of the MEMS pump and the actuation frequency can be adjusted, so the MEMS pump can have better transmission efficiency and good life span at the same time. The industrial value of the present application is extremely high, so the application is submitted in accordance with the law.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A micro-electromechanical systems pump, comprising:
   a first substrate having a plurality of inlets, wherein each of the plurality of inlets is a conical hole;
   a first oxide layer stacked on the first substrate, wherein the first oxide layer has a plurality of converging channels and a converging chamber, wherein the plurality of converging channels is in communication between the converging chamber and the plurality of inlets;
   a second substrate combined with the first substrate, comprising:
   a silicon wafer layer, having:
   an actuation portion being circular and having a maximum stress value and an actuation stress value;
   an outer peripheral portion being in a hollow ring shape and surrounding the periphery of the actuation portion;
   a plurality of connection portions respectively connected between the actuation portion and the outer peripheral portion; and
   a plurality of fluid channels surrounding the periphery of the actuation portion and located between the plurality of connection portions;
   a second oxide layer formed on the silicon wafer layer, wherein the second oxide layer is in a hollow ring shape, and the second oxide layer and the silicon wafer layer together define a vibration chamber;
   a silicon material layer being in a circular shape and located at the second oxide layer, wherein the silicon material layer is combined with the first oxide layer, and the silicon material layer has:
   a perforation located in a center portion of the silicon material layer;
   a vibration portion located in a peripheral area of the perforation; and
   a fixed portion located in a peripheral area of the silicon material layer; and
   a piezoelectric element being in a circular shape and stacked on the actuation portion of the silicon wafer layer, wherein the piezoelectric element has a piezoelectric stress value, wherein a ratio between an area of the plurality of connection portions and an area of the plurality of fluid channels ranges from 0.7:1 to 2.7:1;
   wherein the maximum stress value is greater than the actuation stress value, and the actuation stress value is greater than the piezoelectric stress value.

2. The micro-electromechanical systems pump according to claim 1, wherein the piezoelectric element further comprises:
   a lower electrode layer;
   a piezoelectric layer stacked on the lower electrode layer;
   an insulation layer disposed on a part of a surface of the piezoelectric layer and a part of a surface of the lower electrode layer; and
   an upper electrode layer stacked on the insulation layer and the rest of the surface of the piezoelectric layer where the insulation layer is not disposed, wherein the upper electrode layer is used for electrically connecting to the piezoelectric layer.

3. The micro-electromechanical systems pump according to claim 1, wherein the first substrate is a silicon (Si) wafer.

4. The micro-electromechanical systems pump according to claim 1, wherein the second substrate is a silicon-on-insulator (SOI) wafer.

5. The micro-electromechanical systems pump according to claim 1, wherein a thickness of the first substrate is between 150 and 400 μm (micrometers).

6. The micro-electromechanical systems pump according to claim 1, wherein a thickness of the silicon material layer of the second substrate is between 2 and 5 μm (micrometers).

7. The micro-electromechanical systems pump according to claim 1, wherein a thickness of the silicon wafer layer of the second substrate is between 10 and 20 μm (micrometers).

8. The micro-electromechanical systems pump according to claim 1, wherein a thickness of the first oxide layer is greater than a thickness of the second oxide layer.

9. The micro-electromechanical systems pump according to claim 8, wherein the thickness of the first oxide layer is between 10 and 20 μm (micrometers).

10. The micro-electromechanical systems pump according to claim 8, wherein the thickness of the second oxide layer is between 0.5 and 2 μm (micrometers).

11. The micro-electromechanical systems pump according to claim 1, wherein the maximum stress value is 200 Mpa (million pascals).

12. The micro-electromechanical systems pump according to claim 1, wherein the actuation stress value is between 120 and 160 Mpa (million pascals).

13. The micro-electromechanical systems pump according to claim 1, wherein the piezoelectric stress value is between 30 and 60 Mpa (million pascals).

14. The micro-electromechanical systems pump according to claim 1, wherein the actuation portion has a maximum frequency and an actuation frequency, and the actuation frequency is lower than the maximum frequency.

15. The micro-electromechanical systems pump according to claim 14, wherein the maximum frequency is 2 Mhz (million hertz).

16. The micro-electromechanical systems pump according to claim 14, wherein the actuation frequency is between the 0.8 and 1.9 Mhz (million hertz).

17. The micro-electromechanical systems pump according to claim 1, wherein a diameter of the actuation portion of the silicon wafer layer is between 400 and 500 μm (micrometers).

18. The micro-electromechanical systems pump according to claim 1, wherein a diameter of the piezoelectric element is between 150 and 400 μm (micrometers).

19. A micro-electromechanical systems pump, comprising:
a first substrate having a plurality of inlets, wherein each of the plurality of inlets is a conical hole;
a first oxide layer stacked on the first substrate, wherein the first oxide layer has a plurality of converging channels and a converging chamber, wherein the plurality of converging channels is in communication between the converging chamber and the plurality of inlets;
a second substrate combined with the first substrate, comprising:
a silicon wafer layer, having:
an actuation portion being circular and having a maximum stress value and an actuation stress value;
an outer peripheral portion being in a hollow ring shape and surrounding the periphery of the actuation portion;
a plurality of connection portions respectively connected between the actuation portion and the outer peripheral portion; and
a plurality of fluid channels surrounding the periphery of the actuation portion and located between the plurality of connection portions;
a second oxide layer formed on the silicon wafer layer, wherein the second oxide layer is in a hollow ring shape, and the second oxide layer and the silicon wafer layer together define a vibration chamber;
a silicon material layer being in a circular shape and located at the second oxide layer, wherein the silicon material layer is combined with the first oxide layer, and the silicon material layer has:
a perforation located in a center portion of the silicon material layer;
a vibration portion located in a peripheral area of the perforation; and
a fixed portion located in a peripheral area of the silicon material layer; and
a piezoelectric element being in a circular shape and stacked on the actuation portion of the silicon wafer layer, wherein the piezoelectric element has a piezoelectric stress value;
wherein the maximum stress value is greater than the actuation stress value, and the actuation stress value is greater than the piezoelectric stress value, wherein a ratio between a diameter of the actuation portion and a diameter of the piezoelectric element ranges from 3.6:1 to 1.3:1.

* * * * *